United States Patent
Sawyer et al.

(10) Patent No.: US 11,573,387 B2
(45) Date of Patent: Feb. 7, 2023

(54) OPTICAL ENGINE

(71) Applicant: ROCKLEY PHOTONICS LIMITED, London (GB)

(72) Inventors: Brett Sawyer, Pasadena, CA (US); Seungjae Lee, Pasadena, CA (US); Chia-Te Chou, Pasadena, CA (US); Vivek Raghunathan, Mountain View, CA (US); Vivek Raghuraman, Santa Clara, CA (US); Karlheinz Muth, Richardson, TX (US); David Arlo Nelson, Fort Collins, CO (US)

(73) Assignee: Rockley Photonics Limited

( * ) Notice: Subject to any disclaimer, the term of this patent is extended or adjusted under 35 U.S.C. 154(b) by 47 days.

(21) Appl. No.: 16/836,815

(22) Filed: Mar. 31, 2020

(65) Prior Publication Data

US 2020/0225430 A1    Jul. 16, 2020

Related U.S. Application Data

(63) Continuation-in-part of application No. 16/382,076, filed on Apr. 11, 2019, now Pat. No. 11,054,597.

(60) Provisional application No. 62/829,519, filed on Apr. 4, 2019, provisional application No. 62/656,757, filed on Apr. 12, 2018.

(51) Int. Cl.
*G02B 6/12* (2006.01)
*G02B 6/43* (2006.01)
*G02B 6/42* (2006.01)

(52) U.S. Cl.
CPC .............. *G02B 6/43* (2013.01); *G02B 6/428* (2013.01); *G02B 6/4246* (2013.01); *G02B 2006/12061* (2013.01); *G02B 2006/12142* (2013.01)

(58) Field of Classification Search
CPC .......... G02B 6/43; G02B 6/12; G02B 6/4246; G02B 6/428; G02B 2006/12061; G02B 2006/12142; G02B 6/4274; H01L 25/167
See application file for complete search history.

(56) References Cited

U.S. PATENT DOCUMENTS 8,781,267 B2    7/2014    Julien et al.
8,824,837 B2    9/2014    Ren et al.
(Continued)

FOREIGN PATENT DOCUMENTS

CN    104051399 A    9/2014
CN    106653703 A    5/2017
(Continued)

OTHER PUBLICATIONS

U.S. Office Action from U.S. Appl. No. 16/382,076, dated May 15, 2020, 9 pages.
(Continued)

*Primary Examiner* — Jennifer Doan
(74) *Attorney, Agent, or Firm* — Lewis Roca Rothgerber Christie LLP (57) ABSTRACT

An optical engine. In some embodiments, the optical engine includes an electronic interfacing component including: an upper surface having a plurality of conductors for forming a corresponding plurality of connections to a host board, a lower surface having a plurality of conductors for forming a corresponding plurality of connections to one or more optoelectronic elements, and a plurality of vias extending from the lower surface to the upper surface.

18 Claims, 11 Drawing Sheets

(56) References Cited

U.S. PATENT DOCUMENTS

| | | | |
|---|---|---|---|
| 9,082,745 | B2 | 7/2015 | Morris |
| 9,195,079 | B2 | 11/2015 | Doerr et al. |
| 9,391,708 | B2 | 7/2016 | Fincato et al. |
| 9,490,240 | B2 | 11/2016 | Lucero et al. |
| 9,496,248 | B2 | 11/2016 | Lee et al. |
| 9,515,746 | B2 | 12/2016 | Flens et al. |
| 9,557,478 | B2 | 1/2017 | Doerr et al. |
| 9,575,267 | B1 | 2/2017 | Shastri et al. |
| 9,874,688 | B2 | 1/2018 | Doerr et al. |
| 9,935,088 | B2 | 4/2018 | Budd et al. |
| 2006/0177173 | A1 | 8/2006 | Shastri et al. |
| 2012/0014639 | A1 | 1/2012 | Doany et al. |
| 2013/0230272 | A1* | 9/2013 | Raj .................. G02B 6/428 385/14 |
| 2013/0308898 | A1 | 11/2013 | Doerr et al. |
| 2014/0064659 | A1 | 3/2014 | Doerr et al. |
| 2014/0203175 | A1 | 7/2014 | Kobrinsky et al. |
| 2016/0013866 | A1 | 1/2016 | Doerr |
| 2016/0124164 | A1 | 5/2016 | Doerr |
| 2017/0186670 | A1 | 6/2017 | Budd et al. |
| 2019/0243066 | A1 | 8/2019 | Mahgerefteh et al. |
| 2021/0311269 | A1* | 10/2021 | Goergen ............. H01L 23/3672 |

FOREIGN PATENT DOCUMENTS

| | | |
|---|---|---|
| CN | 107076933 A | 8/2017 |
| EP | 2 820 461 | 9/2013 |
| KR | 10-2017-0073706 | 6/2017 |
| WO | WO 2013/130831 A2 | 9/2013 |
| WO | WO 2013/165344 A1 | 11/2013 |
| WO | WO 2014/014846 A2 | 1/2014 |
| WO | WO 2016/077500 A8 | 5/2016 |

OTHER PUBLICATIONS

International Search Report and Written Opinion of the International Searching Authority, dated Oct. 9, 2019, Corresponding to PCT/IB2019/000607, 13 pages.
International Search Report and Written Opinion of the International Searching Authority, dated Sep. 23, 2019, Corresponding to PCT/IB2019/000382, 13 pages.
International Search Report and Written Opinion of the International Searching Authority, dated Sep. 30, 2019, Corresponding to PCT/IB2019/000383, 13 pages.
U.S. Appl. No. 16/382,076, filed Apr. 11, 2019.
U.S. Appl. No. 16/383,309, filed Apr. 12, 2019.
U.S. Appl. No. 16/393,763, filed Apr. 24, 2019.
U.S. Appl. No. 16/824,609, filed Mar. 19, 2020.
U.S. Office Action from U.S. Appl. No. 16/393,763, dated Mar. 18, 2020, 7 pages.
Website: "Silicon Wafer Integrated Fan-out Technology (SWIFTTM) Packaging for Highly Integrated Products", Amkor, https://c44f5d406df450f4a66b-1b94a87d576253d9446df0a9ca62e142.ssl.cf2.rackcdn.com/2017/12/SWIFT_Packaging_for_Highly_Integrated_Products_WhitePaper_0617.pdf, printed on Apr. 8, 2018, 4 pages.
International Search Report and Written Opinion of the International Searching Authority, dated Aug. 3, 2020, Corresponding to PCT/EP2020/059637, 14 pages.
U.K. Intellectual Property Office Examination Report, dated Nov. 10, 2021, for Patent Application No. GB2017774.7, 4 pages.
Chinese Notification of the First Office Action, for Patent Application No. 201980038846.5, dated Jan. 26, 2022, 9 pages.
Partial English translation of the Chinese Notification of the First Office Action, for Patent Application No. 201980038846.5, dated Jan. 26, 2022, 16 pages.
U.K. Intellectual Property Office Examination Report, dated Sep. 28, 2022, for Patent Application No. GB 2115869.6, 2 pages.

* cited by examiner

| Material ID | Material | Dk | Df | Conductivity |
|---|---|---|---|---|
| 1 | Copper | | | 5.80E+07 |
| 4 | Polyimide | 3.5 | 0.008 | |
| 12 | Gen_EMC | 4.2 | 0.01 | |
| 17 | Silicon Dioxide | 4.2 | 0.01 | |
| 18 | Silicon | 11.9 | | |
| 19 | Silicon Nitride | 7 | 0.01 | |

FIG. 2C

| Via ID | Via Type | Start | Stop | Diameter |
|---|---|---|---|---|
| ViaB | Photo | UBM | BRDL | 150 |
| ViaA | Photo | BRDL | BPAD | 35 |
| Via01 | Photo | RDL1 | TPAD | 25 |
| Via12 | Photo | RDL2 | RDL1 | 35 |
| Via23 | Photo | UBM | RDL2 | 25 |

FIG. 2D

| Units | um |
|---|---|
| Layers | 3 |
| Stack | 1+0+2 |

| Material ID | Material | Dk | Df | Conductivity |
|---|---|---|---|---|
| 1 | Copper | | | 5.80E+07 |
| 4 | Polyimide | 3.5 | 0.008 | |
| 12 | Gen_EMC | 4.2 | 0.01 | |
| 17 | Silicon Dioxide | 4.2 | 0.01 | |
| 18 | Silicon | 11.9 | | |
| 19 | Silicon Nitride | 7 | 0.01 | |

OPTICAL ENGINE

CROSS-REFERENCE TO RELATED APPLICATION(S)

The present application claims priority to and the benefit of U.S. Provisional Application No. 62/829,519, filed Apr. 4, 2019, entitled "OPTICAL ENGINE", and the present application is a continuation-in-part of U.S. patent application Ser. No. 16/382,076, filed Apr. 11, 2019, which claims priority to and the benefit of U.S. Provisional Application No. 62/656,757, filed Apr. 12, 2018, and which claims priority to and the benefit of U.S. Provisional Application No. 62/829,519, filed Apr. 4, 2019. The entire contents of all of the applications identified in this paragraph are incorporated herein by reference.

FIELD

One or more aspects of embodiments according to the present disclosure relate to optoelectronic systems, and more particularly to an optical engine.

BACKGROUND

Related art optical transceivers may be packaged in relatively large packages, and, in operation, may be placed, in part because of their size, relatively far from electrical switching circuitry to which they be may connected. In addition to increasing the overall size of the system, this placement may result in a need for electrical transceiver circuitry that may consume a significant amount of power, for high-speed electrical communications between the optical transceiver and the electrical switching circuitry.

Thus, there is a need for an improved design for a package for an optical transceiver, or an optical engine.

SUMMARY

According to an embodiment of the present invention, there is provided an optical engine, including: an electronic interfacing component including: an upper surface having a plurality of conductors for forming a corresponding plurality of connections to a host board, a lower surface having a plurality of conductors for forming a corresponding plurality of connections to one or more optoelectronic elements, and a plurality of vias extending from the lower surface to the upper surface.

In some embodiments, the electronic interfacing component includes a through-silicon via die, and the plurality of vias includes a plurality of through-silicon vias in the through-silicon via die.

In some embodiments, the through-silicon via die includes silicon with a resistivity of at least 30 ohms-cm.

In some embodiments, the electronic interfacing component includes a silicon integrated circuit including a transistor circuit selected from the group consisting of: amplifier circuits for receiving and amplifying photodetector signals, and driver circuits for driving optical modulators.

In some embodiments, the optical engine further includes an opto-electronic device, the opto-electronic device being an element selected from the group consisting of photodetectors and modulators.

In some embodiments, the optical engine further includes a conductive path from a transistor circuit to the opto-electronic device, the conductive path having a length of less than 500 microns.

In some embodiments, the electronic interfacing component includes a redistribution layer on a bottom surface of the electronic interfacing component.

In some embodiments, the optical engine further includes a silicon photonics integrated circuit, the electronic interfacing component being secured to a top surface of the silicon photonics integrated circuit, the plurality of conductors of the lower surface of the electronic interfacing component being connected to an interconnect layer on the top surface of the silicon photonics integrated circuit.

In some embodiments: the electronic interfacing component includes a silicon integrated circuit including a through-silicon via portion, and the plurality of vias includes a plurality of through-silicon vias in the through-silicon via portion.

In some embodiments, the silicon integrated circuit includes silicon with a resistivity of at least 30 ohms-cm.

In some embodiments, the electronic interfacing component includes a transistor circuit selected from the group consisting of: amplifier circuits for receiving and amplifying photodetector signals, and driver circuits for driving optical modulators.

In some embodiments, the optical engine further includes an opto-electronic device, the opto-electronic device being an element selected from the group consisting of photodetectors and modulators.

In some embodiments, the optical engine further includes a conductive path from a transistor circuit to the opto-electronic device, the conductive path having a length of less than 250 microns.

In some embodiments, the electronic interfacing component includes a global interconnect layer at a bottom surface of the electronic interfacing component.

In some embodiments, the optical engine further includes a silicon photonics integrated circuit, the electronic interfacing component being secured to a top surface of the silicon photonics integrated circuit, the plurality of conductors of the lower surface of the electronic interfacing component being connected to an interconnect layer on the top surface of the silicon photonics integrated circuit.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of an optical engine provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
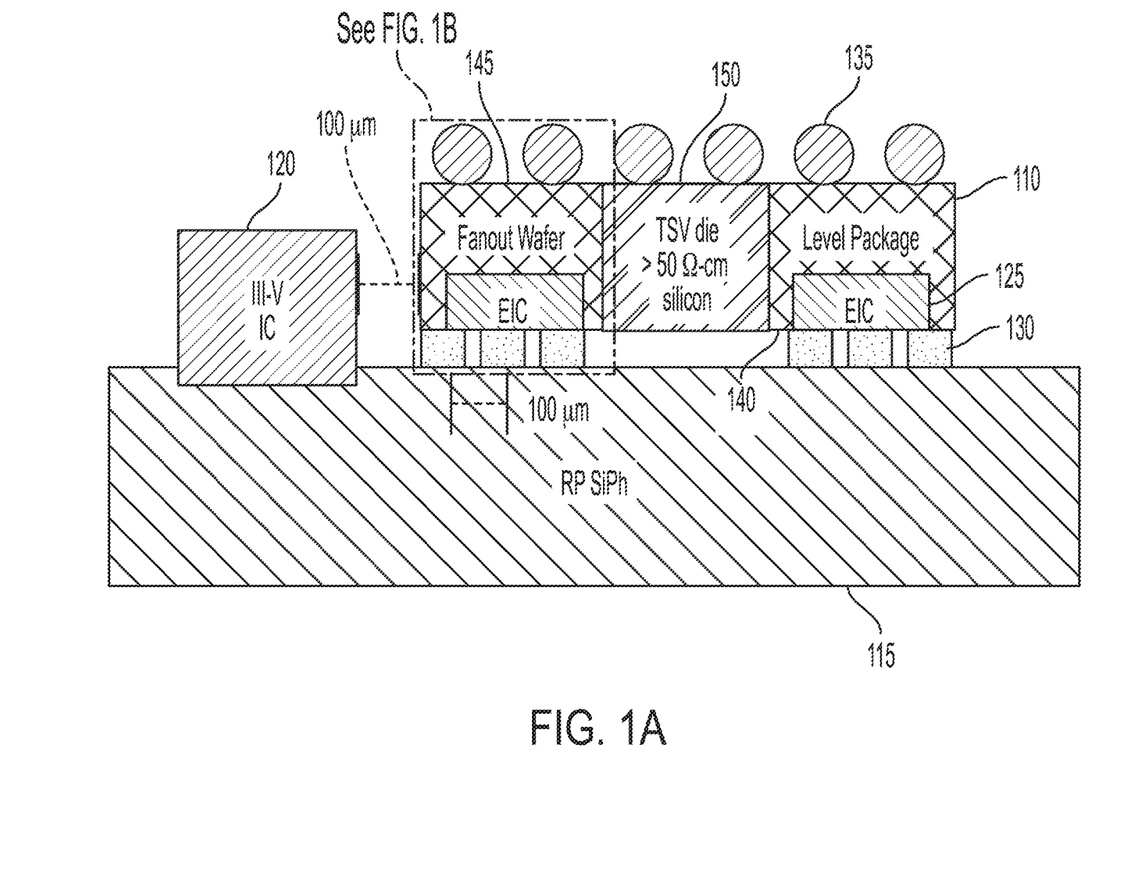
FIG. 1A is a schematic cross-sectional side view of an optical engine, according to an embodiment of the present disclosure.
Figure 1B:
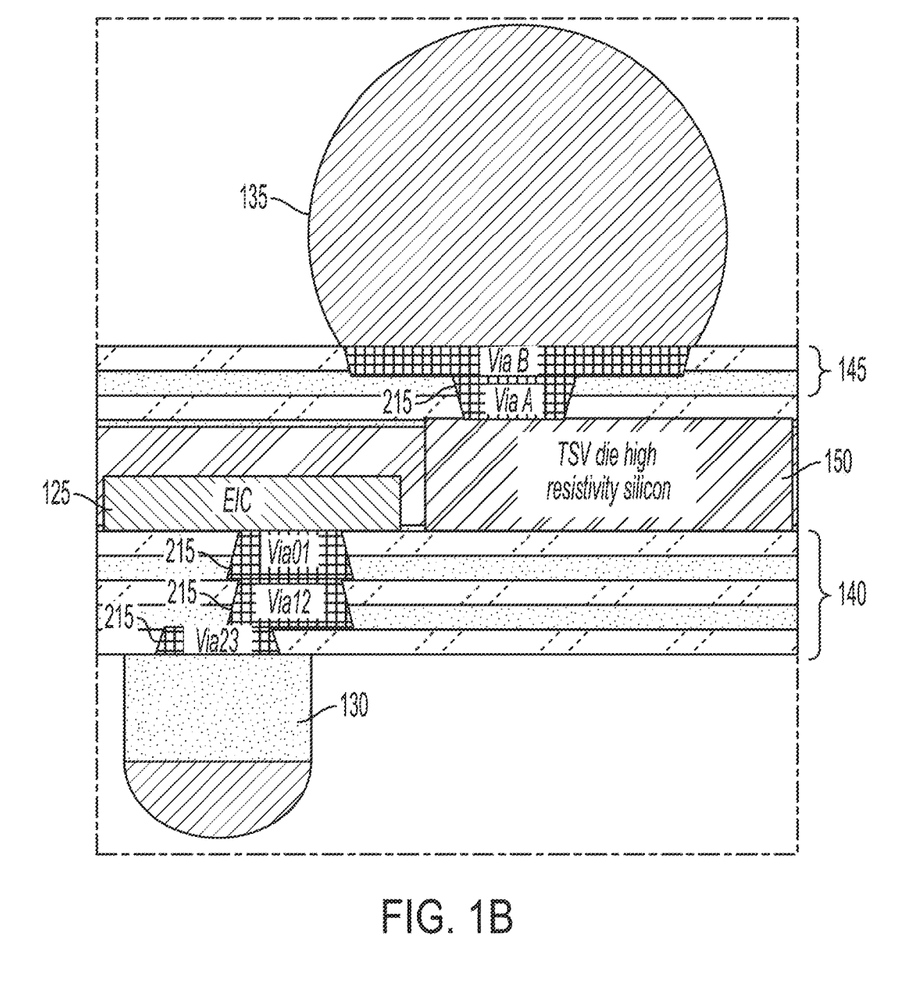
FIG. 1B is an approximate enlarged view of a portion of FIG. 1A, according to an embodiment of the present disclosure.

Referring to FIGS. 1A and 1B, in some embodiments an optical engine includes a fanout wafer level package 110 on a silicon photonics integrated circuit 115. The silicon photonics integrated circuit 115 may be coupled to one or more optical fibers, each of which may be used, by the optical engine, to receive modulated light (carrying data) or to transmit modulated light. The silicon photonics integrated circuit 115 may include one or more opto-electronic devices such as photodetectors for converting optical signals to electrical signals, or modulators 120 (e.g., as separate III-V chips flip-chip assembled on the silicon photonics integrated circuit 115). Each of the modulators 120 may be configured to receive unmodulated light (e.g., laser light guided to the optical engine in one of the fibers), and to perform amplitude modulation of the light. The modulators 120 may be Mach-Zehnder modulators, for example, or electro-absorption modulators.

The photodetectors may be fabricated directly on the silicon photonics integrated circuit 115 (e.g., being formed in part from crystalline SiGe grown on the wafer of the silicon photonics integrated circuit 115) or they may be separate chips (e.g., separate III-V chips flip-chip assembled on the silicon photonics integrated circuit 115). The silicon photonics integrated circuit 115 may also include optical waveguides for routing light between the fibers and the opto-electronic devices, and tapers (e.g., tapered waveguides) for transforming optical mode sizes between (i) those that may propagate on optical fibers, (ii) those suitable for guiding light efficiently on the surface (e.g. on the top surface) of the silicon photonics integrated circuit 115, and (iii) those suitable for interacting with the opto-electronic devices.

The fanout wafer level package 110 may include one or more electronic integrated circuits (EIC) 125 that may operate as interfaces to the photodetectors and to the modulators 120. For example, the electronic integrated circuits 125 may include transimpedance amplifiers for amplifying electrical signals from the photodetectors, and driver amplifiers for driving the modulators 120. Each electronic integrated circuit 125 may be positioned near an edge of the fanout wafer level package 110 as shown, to reduce the lengths of electrical paths between (i) the photodetectors and modulators 120 and (ii) the electronic integrated circuits 125 interfacing to them. For simplicity, FIG. 1A shows only one modulator 120, on one side of the fanout wafer level package 110; in some embodiments opto-electronic devices such as photodetectors or modulators 120 may be present on both sides, or around the perimeter of, the fanout wafer level package 110, each connected to one or more electronic integrated circuits 125 in the fanout wafer level package 110, at an edge near the opto-electronic device.

The fanout wafer level package 110 may include a lower redistribution layer (RDL) 140 on the bottom surface of the fanout wafer level package 110. Electrical connections to the opto-electronic devices on the silicon photonics integrated circuit 115 may be formed through a plurality of conductors, such as copper pillars 130, on the bottom surface of the fanout wafer level package 110. These conductors may form connections to an interconnect layer, on the top surface of the silicon photonics integrated circuit 115, which may include one or more insulating layers and one or more layers of conductive (e.g., metal) traces. The interconnect layer on the top surface of the silicon photonics integrated circuit 115 may in turn form connections to the opto-electronic devices on the silicon photonics integrated circuit 115.

As such, the electrical path from one of the electronic integrated circuits 125 to an opto-electronic device, e.g., to a modulator 120, may extend through conductive traces in the lower redistribution layer 140 to the copper pillars 130, through copper pillars 130 to the interconnect layer on the top surface of the silicon photonics integrated circuit 115, and through the interconnect layer on the top surface of the silicon photonics integrated circuit 115 to the opto-electronic device. The gap separating the opto-electronic device and the fanout wafer level package 110 may be about 100 microns (as indicated in FIG. 1A) so that manufacturing variations in the dimensions of the fanout wafer level package 110, and errors in placing it on the silicon photonics integrated circuit 115, will not cause the fanout wafer level package 110 to collide with the opto-electronic device when the fanout wafer level package 110 is placed on the silicon photonics integrated circuit 115. Electrical paths between the opto-electronic devices and the electronic integrated circuits 125 may have lengths of less than 500 microns (e.g., lengths of 350 microns or less).

The fanout wafer level package 110 may have a plurality of conductors, such as solder balls 135, on its top surface, for making a plurality of connections to a host board or switch ASIC substrate. The host board or switch ASIC substrate may include electronic data processing circuitry such as a CMOS packet switching circuit. The fanout wafer level package 110 may also have an upper redistribution layer 145 on its top surface. If an upper redistribution layer 145 is present, the solder balls 135 may be connected to conductive traces in the upper redistribution layer 145. A through-silicon via die 150 forms conductive paths between the lower redistribution layer 140 and the upper redistribution layer 145 if present (or between the lower redistribution layer 140 and the solder balls 135, if the upper redistribution layer 145 is absent). If the upper redistribution layer 145 is absent, the solder balls 135 may be present only on the top surface of the through-silicon via die 150, or any solder balls 135 that are not on the top surface of the through-silicon via die 150 may be unconnected, or, e.g., connected to ground on the next higher level assembly. The through-silicon via die 150 may be formed of high-resistivity silicon (e.g., silicon with a resistivity of at least 30 ohms, e.g., with a resistivity of 50 ohms-cm or more) so that the insertion loss incurred upon propagation through the conductors in the through-silicon via die 150 is not unacceptably high, as discussed in further detail below. The fanout wafer level package 110 may operate as an electronic interfacing component for forming an interface between the silicon photonics integrated circuit 115 and a host board (or switch ASIC substrate). An epoxy overmold may encapsulate the electronic integrated circuits 125 and the through-silicon via die 150.

FIG. 1B shows a schematic, or approximate, enlarged view of a portion of FIG. 1A (the dimensions and elements of FIG. 1B differ somewhat from those of FIG. 1A).

Figure 2A:
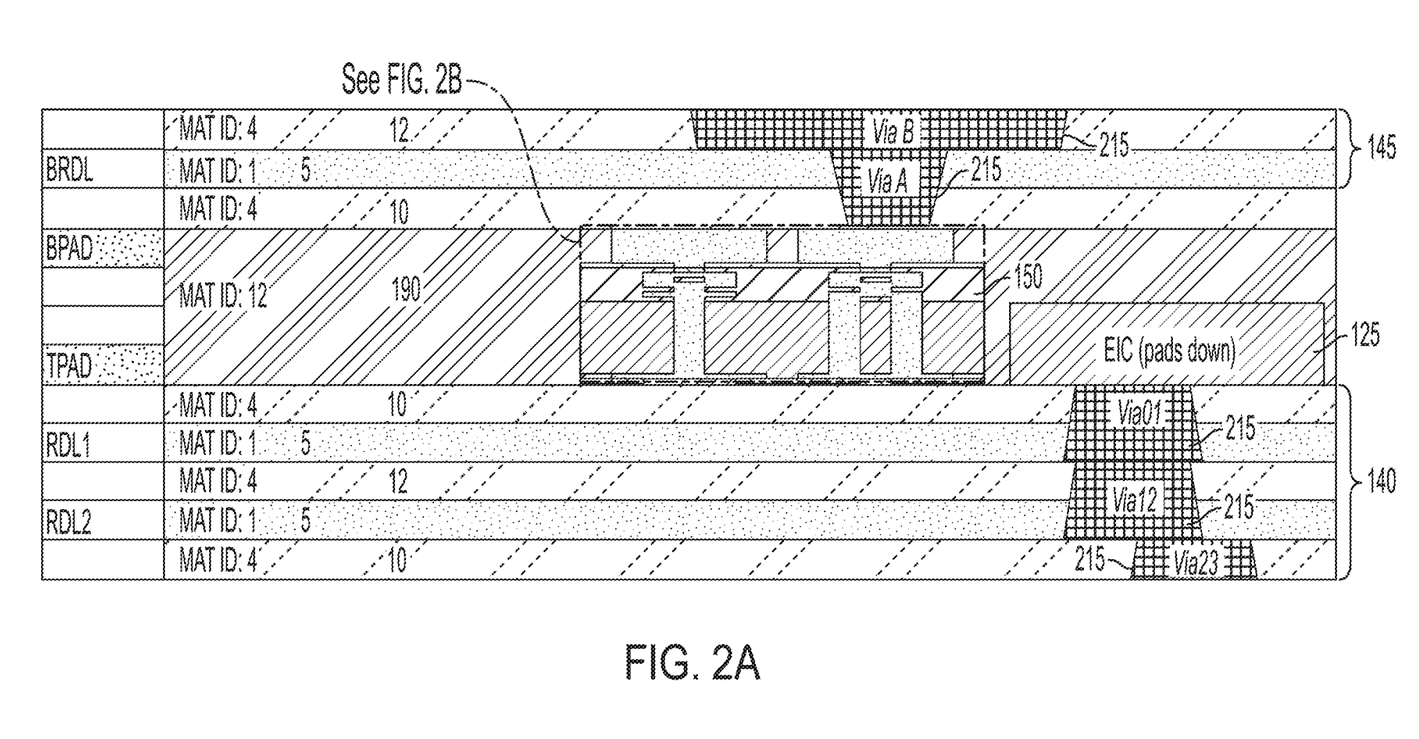
FIG. 2A is a stack-up diagram, according to an embodiment of the present disclosure.
Figure 2B:
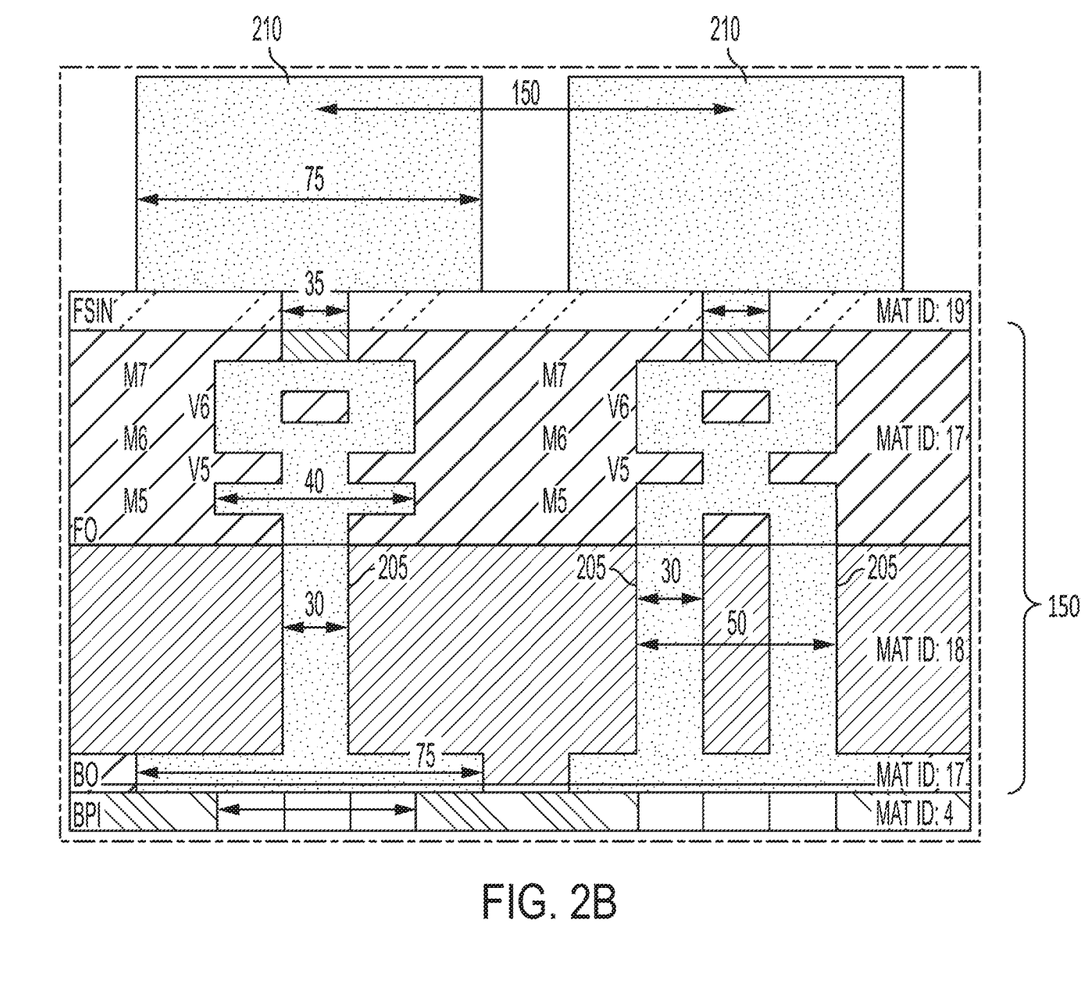
FIG. 2B is an enlarged view of a portion of the embodiment of FIG. 2A.

FIGS. 2A and 2B shows a stack-up, for some embodiments, of the layers of the fanout wafer level package 110 of FIGS. 1A and 1B, including the stack-up of the lower redistribution layer 140, the upper redistribution layer 145, and the through-silicon via die 150. FIG. 2B is an enlarged view of the through-silicon via die 150, and copper pillar bumps 210 formed on it. In FIG. 2B, "FSIN" refers to front-side silicon nitride, "BO" refers to backside oxide, and "BPI" refers to back-side polyimide. Dimensions are shown in microns, for some embodiments. In the embodiment illustrated, the lower redistribution layer 140 consists of layers of insulating material (e.g. polyimide) and conducting material (e.g. copper, with RDL vias 215, such as copper microvias Via01, Via12 and Via23) to form electrical connections between the electronic integrated circuits 125 and silicon photonics integrated circuit 115. The upper redistribution layer 145 similarly consists of insulating and conducting layers to form electrical connections between the through-silicon via die 150 and the next higher level assembly (e.g., the host board or switch ASIC substrate). The through-silicon via die 150 consist of 30 micron vias formed in 150 micron thick silicon resulting in a through-silicon via aspect ratio of at least 6:1 for this embodiment.

Figure 2C:
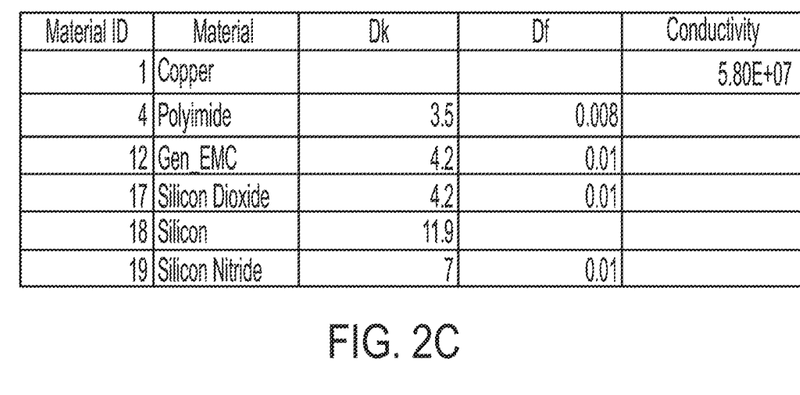
FIG. 2C is a table of materials, for the embodiment of FIGS. 2A and 2B, according to an embodiment of the present disclosure.
Figures 2D, 2E:
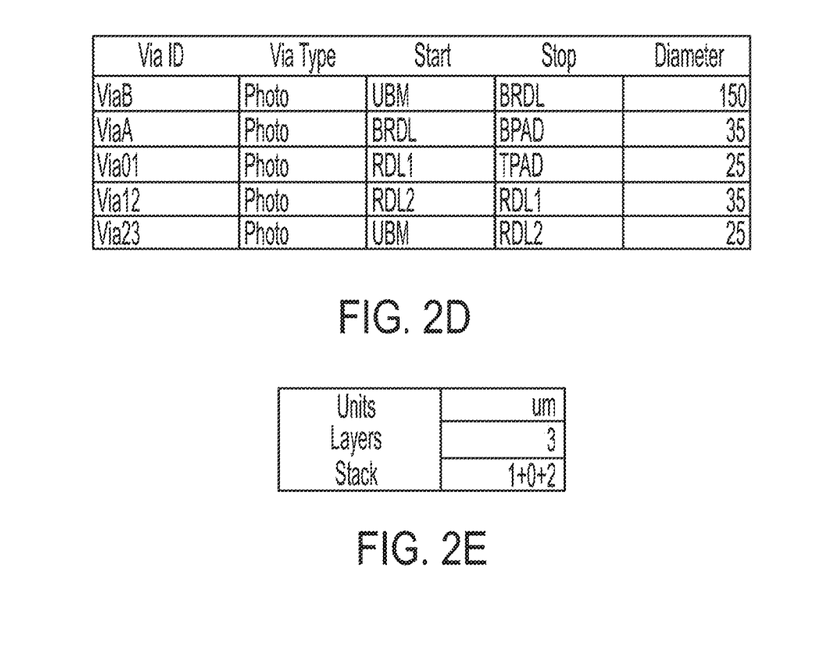
FIG. 2D is a table of via characteristics, according to an embodiment of the present disclosure.
FIG. 2E is a table showing a package stack-up, according to an embodiment of the present disclosure.

Three interconnect layers and a copper pillar bump layer are formed on top of the through-silicon vias 205, in the through-silicon via die 150. The three interconnect layers consist of insulation (e.g. silicon dioxide) and conduction (e.g. copper with copper vias V5 and V6) layers to form electrical interconnections between the through-silicon vias 205 and copper pillar bumps 210. The 50 micron tall copper pillar bumps 210 are used to provide electrical connections between the through-silicon vias 205 and upper redistribution layer 145. Parallel through-silicon vias 205 may be used (as shown in the right-hand portion of the through-silicon via die 150, in FIG. 2B) to increase current handling and to improve yield. Numbers in FIGS. 2A and 2B (e.g., "5", "10", "12" in FIG. 2A, and "30", "35", "40", "75", "150" in FIG. 2B) represent layer thicknesses and transverse dimensions respectively. FIG. 2C shows materials (identified by a material ID number in the first column of FIG. 2C, and by corresponding annotations (e.g., "MAT ID 4", "MAT ID 1") in FIG. 2A), and material properties, including, for the insulators listed, dielectric constant (Dk), and dielectric tangent (Df). FIG. 2D shows characteristics of the RDL vias 215. In FIG. 2D, "Start" and "Stop" identify layers at which the RDL vias 215 start and stop, ("UBM" being the under-bump metallization layer under the solder balls 135). FIG. 2E is the package stack-up, in some embodiments. In FIG. 2E, "1+0+2" indicates that the package includes 1 layer of back-side routing and 2 layers of front-side routing.

Figure 3A:
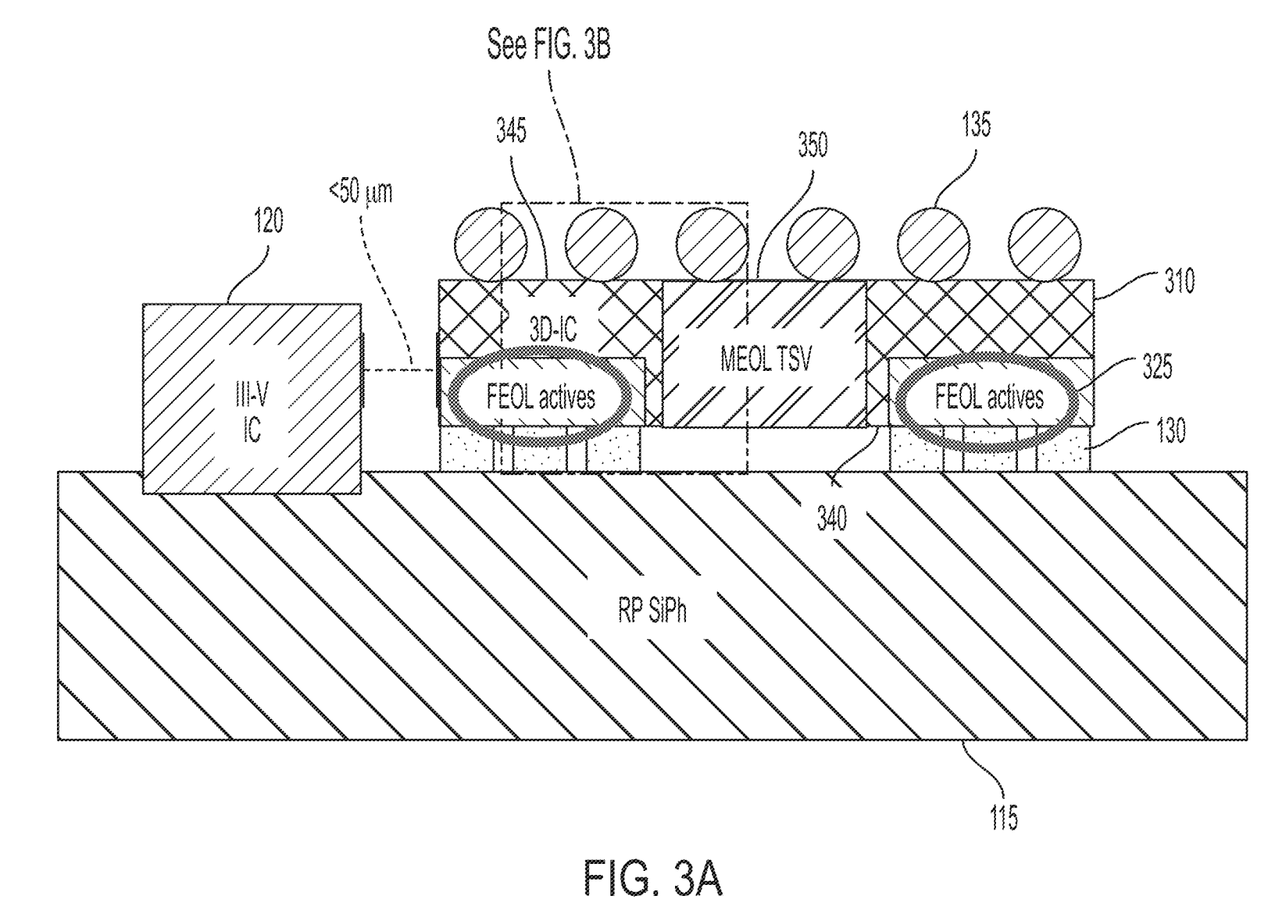
FIG. 3A is a schematic cross-sectional side view of an optical engine, according to an embodiment of the present disclosure.

FIG. 3A shows an optical engine in an embodiment in which a single silicon integrated circuit 310 is employed instead of the fanout wafer level package 110 of FIG. 1A, to operate as an electronic interfacing component for forming an interface between the silicon photonics integrated circuit 115 and a host board (or switch ASIC substrate). The silicon integrated circuit 310 includes one or more transistor circuits 325 (e.g., front-end-of-line (FEOL) actives), e.g., transimpedance amplifiers for amplifying electrical signals from the photodetectors and driver amplifiers for driving the modulators 120. These transistor circuits may operate as interfaces to the photodetectors and to the modulators 120. The silicon integrated circuit 310 may include a back-side global interconnect layer 340 at (e.g., just inside) its bottom surface, and a front-side global interconnect layer 345 at (e.g., just inside) its top surface.

Like the fanout wafer level package 110 of FIG. 1A, the silicon integrated circuit 310 of FIG. 3A may include a plurality of conductors, such as copper pillars 130, for forming connections to the interconnect layer on the top surface of the silicon photonics integrated circuit 115, and a plurality of conductors, such as solder balls 135, on its top surface for making a plurality of connections to a host board or switch ASIC substrate. The silicon integrated circuit 310 may include a mid-end of line (MEOL) through-silicon via portion 350 for forming connections from the back-side global interconnect layer 340 to the front-side global interconnect layer 345, in a manner analogous to that of the through-silicon via die 150 of the fanout wafer level package 110 of FIG. 1A. The through-silicon via portion 350 may be fabricated, in the silicon integrated circuit 310, after the transistor circuits 325 have been fabricated.

The fabrication tolerances of the silicon integrated circuit 310 may be significantly tighter than those of the fanout wafer level package 110 of FIG. 1A. As such, it may be possible to place the opto-electronic devices closer to the silicon integrated circuit 310, with the gap between the opto-electronic devices and the silicon integrated circuit 310 being, for example, 50 microns or less, and the electrical paths between the transistor circuits 325 and the opto-electronic devices to which they are connected may be correspondingly shorter. Electrical paths between the opto-electronic devices and the electronic integrated circuits 125 may have lengths of less than 250 microns (e.g., lengths of 150 microns or less).

Figure 3B:
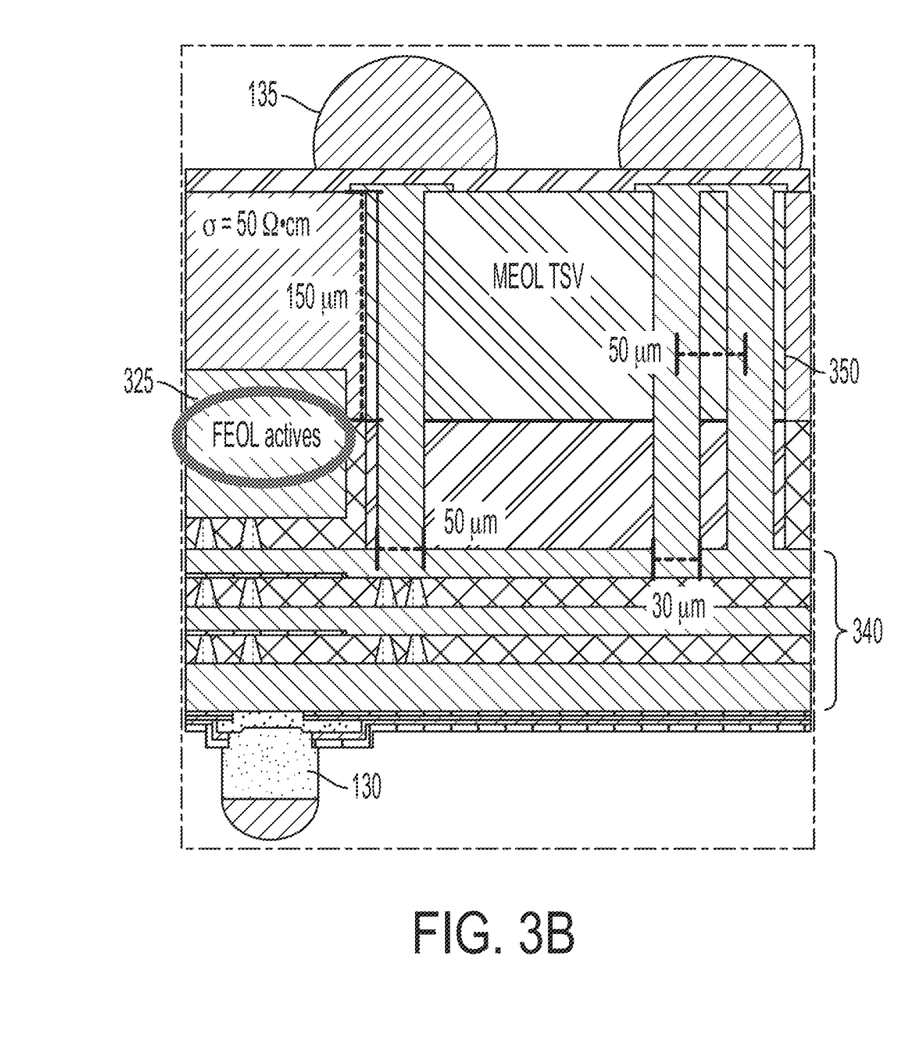
FIG. 3B is an approximate enlarged view of a portion of FIG. 3A, according to an embodiment of the present disclosure.
Figure 4A:
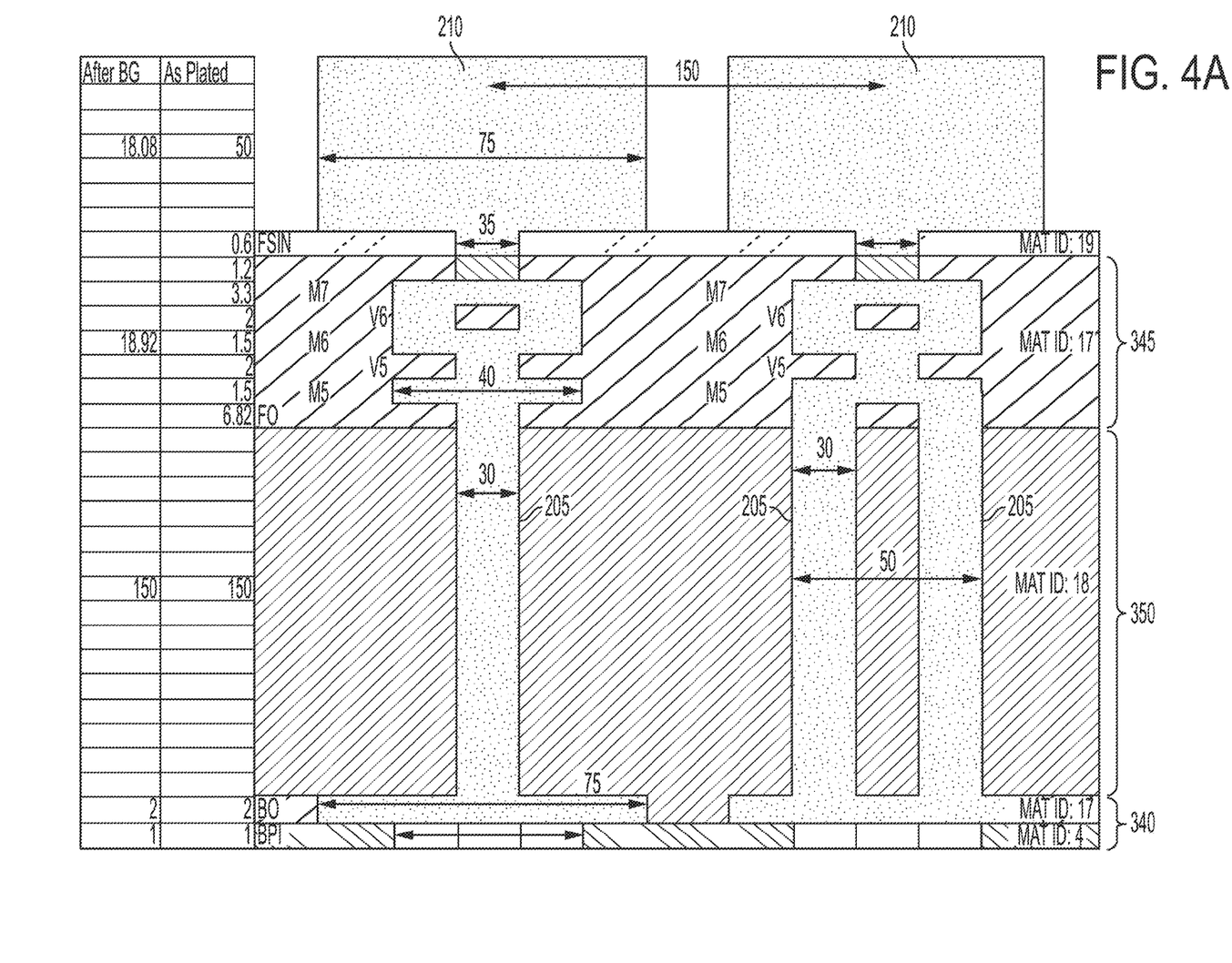
FIG. 4A is a stack-up diagram, according to an embodiment of the present disclosure.
Figure 4B:
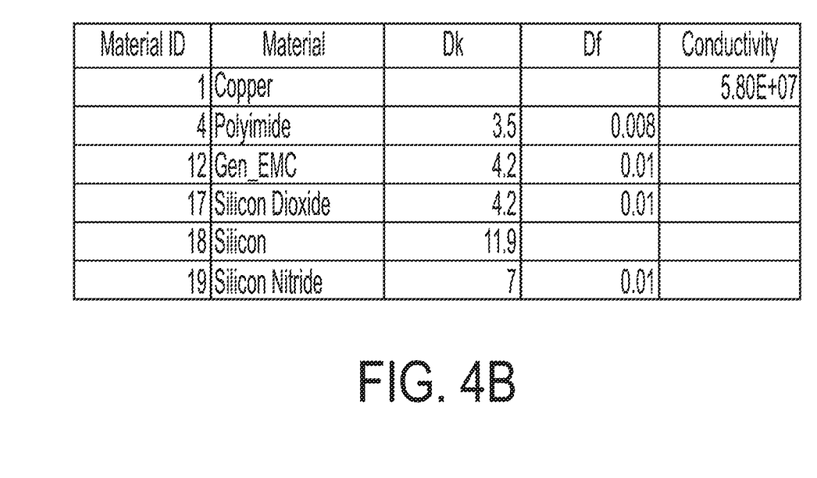
FIG. 4B is a table of materials, for the embodiment of FIG. 4A, according to an embodiment of the present disclosure.
Figure 5:
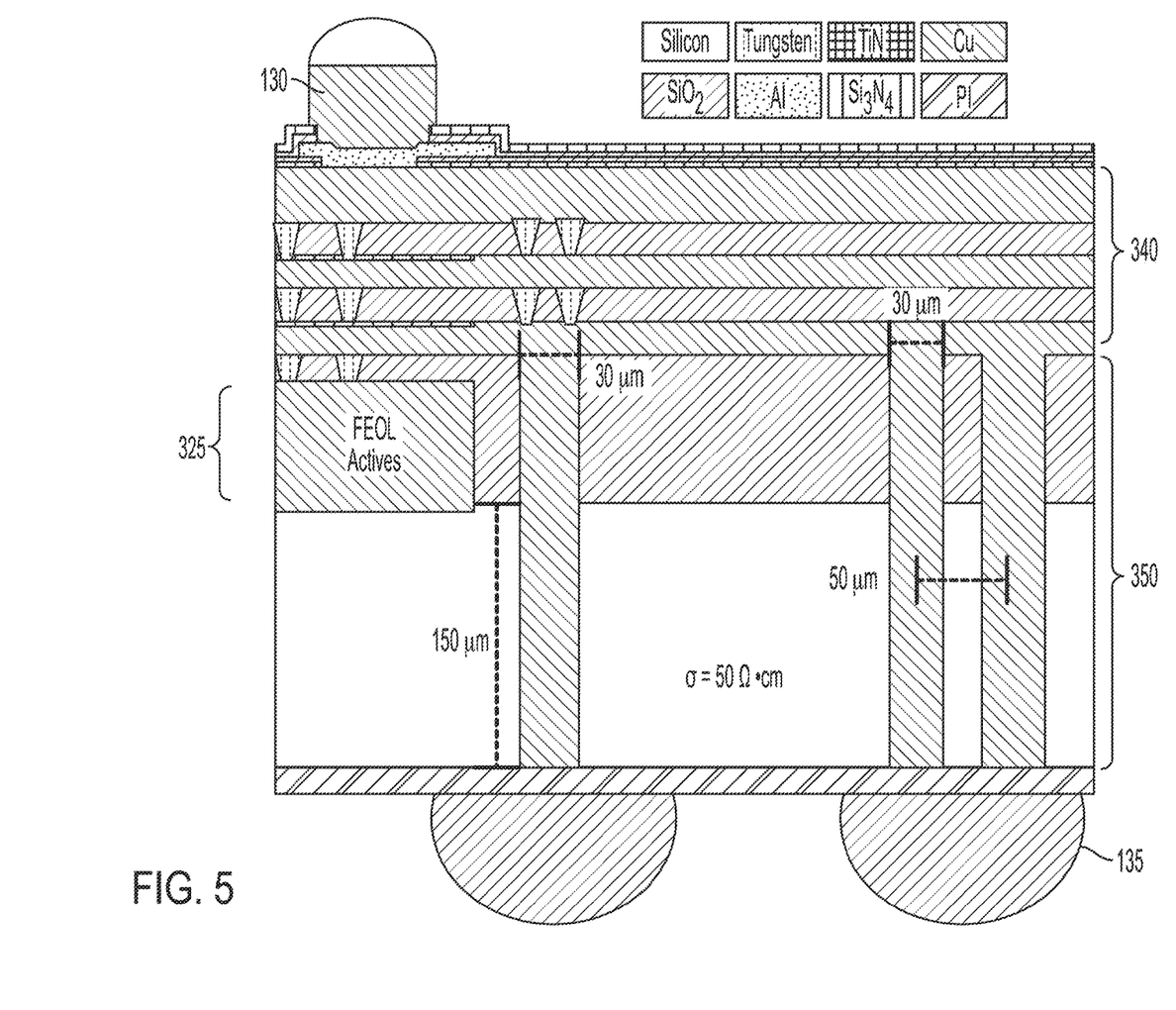
FIG. 5 is an approximate enlarged view of a portion of FIG. 3A, according to an embodiment of the present disclosure.

FIG. 3B shows a schematic, or approximate, enlarged view of a portion of FIG. 3A (the dimensions and elements of FIG. 3B differ somewhat from those of FIG. 3A). FIG. 4A shows a stack-up, for some embodiments, of the layers of the silicon integrated circuit 310 of FIGS. 3A and 3B, including the stack-up of the front-side global interconnect layer 345, of the back-side interconnect layer 340, and the through-silicon via portion 350. Dimensions are shown in microns, for some embodiments, and materials (listed in the table of FIG. 4B) are shown by corresponding annotations (e.g., "MAT ID 19", "MAT ID 17"). FIG. 5 shows dimensions of various elements in a portion of the silicon integrated circuit 310, in one embodiment. The portion shown includes a portion of the transistor circuits 325, a portion of the through-silicon via portion 350, and a portion of the back-side global interconnect layer 340. FIG. 5 is inverted relative to FIG. 3A, so that, for example, the back-side global interconnect layer 340 is at the top of the silicon integrated circuit 310 in the view of FIG. 5.

Figure 6:
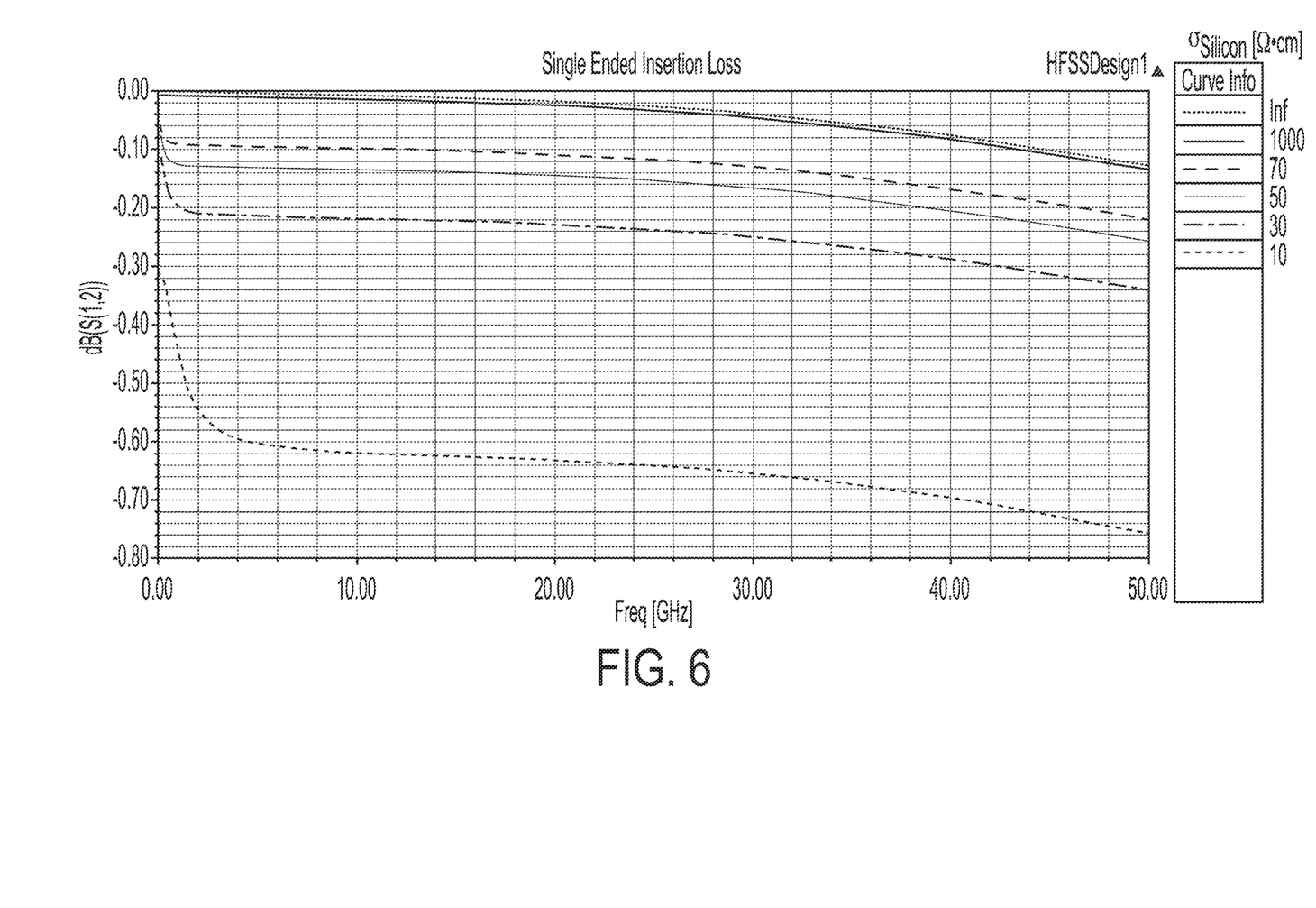
FIG. 6 is graph of S21 as a function of frequency, according to an embodiment of the present disclosure.

FIG. 6 shows simulated results of S21 (corresponding to the insertion loss) for transmission through a through-silicon via, as a function of frequency, for various values of the resistivity of the silicon used to form either the through-silicon via die 150 or used as the substrate to form the silicon integrated circuit 310. The top-most curve, labeled "Inf" In the legend, corresponds to hypothetical silicon with zero conductivity. It may be seen that the insertion loss for silicon having a resistivity of 50 ohms-cm is less than 0.25 dB at frequencies below 20 GHz, and that it is significantly lower than, for example, the insertion loss for silicon having a resistivity of 10 ohms-cm.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Although exemplary embodiments of an optical engine have been specifically described and illustrated herein, many modifications and variations will be apparent to those skilled in the art. Accordingly, it is to be understood that an optical engine constructed according to principles of this disclosure may be embodied other than as specifically described herein. The invention is also defined in the following claims, and equivalents thereof.

What is claimed is:

1. An optical engine, comprising:
    an electronic interfacing component comprising:
        an upper surface having a plurality of conductors for forming a corresponding plurality of connections to a host board,
        a lower surface having a plurality of conductors for forming a corresponding plurality of connections to one or more optoelectronic elements,
        a lower redistribution layer on the lower surface and comprising an insulating material and at least one conductive trace,
        an upper redistribution layer on the upper surface and comprising an insulating material and at least one conductive trace, and
        a plurality of vias extending from the lower surface to the upper surface.

2. The optical engine of claim 1, wherein:
    the electronic interfacing component comprises a through-silicon via die, and
    the plurality of vias comprises a plurality of through-silicon vias in the through-silicon via die.

3. The optical engine of claim 2, wherein the through-silicon via die comprises silicon with a resistivity of at least 30 ohms-cm.

4. The optical engine of claim 1, wherein the electronic interfacing component comprises a silicon integrated circuit comprising a transistor circuit selected from the group consisting of:
    amplifier circuits for receiving and amplifying photodetector signals, and
    driver circuits for driving optical modulators.

5. The optical engine of claim 1, further comprising an opto-electronic device, the opto-electronic device being an element selected from the group consisting of photodetectors and modulators.

6. The optical engine of claim 5, further comprising a conductive path from a transistor circuit to the opto-electronic device, the conductive path having a length of less than 500 microns.

7. The optical engine of claim 1, further comprising a silicon photonics integrated circuit, the electronic interfacing component being secured to a top surface of the silicon photonics integrated circuit, the plurality of conductors of the lower surface of the electronic interfacing component being connected to an interconnect layer on the top surface of the silicon photonics integrated circuit.

8. The optical engine of claim 1, wherein:
    the electronic interfacing component comprises a silicon integrated circuit comprising a through-silicon via portion, and
    the plurality of vias comprises a plurality of through-silicon vias in the through-silicon via portion.

9. The optical engine of claim 8, wherein the silicon integrated circuit comprises silicon with a resistivity of at least 30 ohms-cm.

10. The optical engine of claim 8, wherein the electronic interfacing component comprises a transistor circuit selected from the group consisting of:
    amplifier circuits for receiving and amplifying photodetector signals, and
    driver circuits for driving optical modulators.

11. The optical engine of claim 8, further comprising an opto-electronic device, the opto-electronic device being an element selected from the group consisting of photodetectors and modulators.

12. The optical engine of claim 11, further comprising a conductive path from a transistor circuit to the opto-electronic device, the conductive path having a length of less than 250 microns.

13. An optical engine, comprising:
    an electronic interfacing component comprising:
        an upper surface having a plurality of conductors for forming a corresponding plurality of connections to a host board,
        a lower surface having a plurality of conductors for forming a corresponding plurality of connections to one or more optoelectronic elements,
        a silicon integrated circuit or a fanout wafer level package between the lower surface and the upper surface, and
        a plurality of vias extending from the lower surface to the upper surface; and
    a silicon photonics integrated circuit,
    an interconnect layer being on a top surface of the silicon photonics integrated circuit and comprising an insulating material and one or more conductive traces, the electronic interfacing component being secured to the top surface of the silicon photonics integrated circuit, and a conductor of the plurality of conductors of the lower surface of the electronic interfacing component being in contact with a conductive trace of the one or more conductive traces of the interconnect layer.

14. The optical engine of claim 8, further comprising a silicon photonics integrated circuit, the electronic interfacing component being secured to a top surface of the silicon photonics integrated circuit, the plurality of conductors of the lower surface of the electronic interfacing component being connected to an interconnect layer on the top surface of the silicon photonics integrated circuit.

15. The optical engine of claim 13, wherein the electronic interfacing component comprises a global interconnect layer at the lower surface of the electronic interfacing component.

16. The optical engine of claim 13, wherein the optical engine comprises a transistor circuit or an electronic integrated circuit between the lower surface and the upper surface.

17. The optical engine of claim 16, wherein the silicon photonics integrated circuit comprises an opto-electronic device, and a conductive path from the transistor circuit to the opto-electronic device, or from the electronic integrated circuit to the opto-electronic device, is less than 500 microns.

18. An optical engine, comprising:
an electronic interfacing component comprising:
   an upper surface having a plurality of conductors for forming a corresponding plurality of connections to a host board,
   a lower surface having a plurality of conductors for forming a corresponding plurality of connections to one or more optoelectronic elements,
   a lower redistribution layer on the lower surface and comprising at least one conductive trace, or an upper redistribution layer on the upper surface and comprising at least one conductive trace, and
   a plurality of vias extending from the lower surface to the upper surface; and
a silicon photonics integrated circuit,
an interconnect layer being on a top surface of the silicon photonics integrated circuit and comprising an insulating material and one or more conductive traces, the electronic interfacing component being secured to the top surface of the silicon photonics integrated circuit, and a conductor of the plurality of conductors of the lower surface of the electronic interfacing component being in contact with a conductive trace of the one or more conductive traces of the interconnect layer.

* * * * *